United States Patent
Gan et al.

(10) Patent No.: US 9,793,319 B2
(45) Date of Patent: Oct. 17, 2017

(54) MULTILAYERED SEED STRUCTURE FOR PERPENDICULAR MTJ MEMORY ELEMENT

(71) Applicant: Avalanche Technology, Inc., Fremont, CA (US)

(72) Inventors: Huadong Gan, Fremont, CA (US); Yiming Huai, Pleasanton, CA (US); Bing K. Yen, Cupertino, CA (US); Roger K. Malmhall, San Jose, CA (US); Yuchen Zhou, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/295,002

(22) Filed: Oct. 17, 2016

(65) Prior Publication Data
US 2017/0033156 A1   Feb. 2, 2017

Related U.S. Application Data

(63) Continuation of application No. 14/687,161, filed on Apr. 15, 2015, now Pat. No. 9,496,489.

(60) Provisional application No. 62/001,554, filed on May 21, 2014.

(51) Int. Cl.
| | |
|---|---|
| *H01L 43/08* | (2006.01) |
| *H01L 43/10* | (2006.01) |
| *H01L 27/22* | (2006.01) |
| *H01L 43/02* | (2006.01) |
| *G11C 11/16* | (2006.01) |

(52) U.S. Cl.
CPC .......... *H01L 27/226* (2013.01); *G11C 11/161* (2013.01); *H01L 43/02* (2013.01); *H01L 43/08* (2013.01); *H01L 43/10* (2013.01)

(58) Field of Classification Search
CPC ......... H01L 43/00; H01L 43/02; H01L 43/08; H01L 43/10
See application file for complete search history.

(56) References Cited

U.S. PATENT DOCUMENTS

| | | | |
|---|---|---|---|
| 5,701,223 A | 12/1997 | Fontana et al. | |
| 6,473,337 B1 | 10/2002 | Tran et al. | |
| 7,696,551 B2 | 4/2010 | Xiao et al. | |
| 8,184,411 B2 | 5/2012 | Zhang et al. | |
| 8,541,855 B2 | 9/2013 | Jan et al. | |
| 9,490,054 B2 * | 11/2016 | Jan ......................... | H01L 43/10 |
| 2005/0041463 A1 | 2/2005 | Drewes | |

(Continued)

*Primary Examiner* — Cuong Q Nguyen
(74) *Attorney, Agent, or Firm* — Bing K. Yen

(57) ABSTRACT

The present invention is directed to a magnetic random access memory element that includes a multilayered seed structure formed by interleaving multiple layers of a first transition metal with multiple layers of a second transition metal; and a first magnetic layer formed on top of the multilayered seed structure. The first magnetic layer has a multilayer structure formed by interleaving layers of the first transition metal with layers of a magnetic material and has a first fixed magnetization direction substantially perpendicular to a layer plane thereof. The first transition metal is platinum or palladium, while the second transition metal is selected from the group consisting of tantalum, titanium, zirconium, hafnium, vanadium, niobium, chromium, molybdenum, and tungsten.

20 Claims, 4 Drawing Sheets

(56) References Cited

U.S. PATENT DOCUMENTS

| | | |
|---|---|---|
| 2005/0079638 A1 | 4/2005 | Drewes et al. |
| 2005/0185455 A1 | 8/2005 | Huai |
| 2006/0061915 A1 | 3/2006 | Zhang et al. |
| 2007/0264728 A1 | 11/2007 | Miura et al. |
| 2007/0297220 A1 | 12/2007 | Yoshikawa et al. |
| 2008/0246104 A1 | 10/2008 | Ranjan et al. |
| 2008/0261082 A1 | 10/2008 | Nishimura et al. |
| 2009/0213642 A1 | 8/2009 | Raberg et al. |
| 2010/0315863 A1 | 12/2010 | Zhu et al. |
| 2011/0064969 A1 | 3/2011 | Chen et al. |
| 2012/0126905 A1 | 5/2012 | Zhang et al. |
| 2013/0009260 A1 | 1/2013 | Apalkov et al. |
| 2014/0103469 A1 | 4/2014 | Jan et al. |
| 2014/0153324 A1 | 6/2014 | Yu |
| 2015/0008550 A1 | 1/2015 | Min et al. |

\* cited by examiner ns of the invention, and in the invention generally.

MULTILAYERED SEED STRUCTURE FOR PERPENDICULAR MTJ MEMORY ELEMENT

CROSS-REFERENCE TO RELATED APPLICATIONS

The present application is a continuation of the commonly assigned application bearing Ser. No. 14/687,161 filed Apr. 15, 2015, entitled "MAGNETIC RANDOM ACCESS MEMORY WITH MULTILAYERED SEED STRUCTURE," which claims the benefit of the provisional application bearing Ser. No. 62/001,554 filed May 21, 2014, entitled "Magnetic Random Access Memory with Multilayered Seed Structure."

BACKGROUND

The present invention relates to a magnetic random access memory (MRAM) device, and more particularly, to a spin transfer torque MRAM device including a multilayered seed structure.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of a switching current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 50 and a magnetic free layer 52 with an insulating tunnel junction layer 54 interposed therebetween, thereby collectively forming a magnetic tunnel junction (MTJ) 56. The magnetic reference layer 50 and free layer 52 have magnetization directions 58 and 60, respectively, which are substantially perpendicular to the respective layer planes. Therefore, the MTJ 56 is a perpendicular type comprising the magnetic layers 50 and 52 with perpendicular anisotropy. Upon application of a switching current through the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. When the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistance of the perpendicular MTJ 56. Conversely, the electrical resistance of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

One of many advantages of STT-MRAM over other types of non-volatile memories is scalability. As the size of the perpendicular MTJ 56 is reduced, the current required to switch the magnetization direction 60 of the magnetic free layer 52 is reduced accordingly, thereby reducing power consumption. However, the resistance distribution for the MTJ memory element population in an STT-MRAM device also becomes broader with miniaturization of the perpendicular MTJ 56, necessitating higher tunnel magnetoresistance (TMR) ratio to distinguish between the low and high resistance states.

For the foregoing reasons, there is a need for an STT-MRAM device that has a high TMR ratio and that can be inexpensively manufactured.

SUMMARY

The present invention is directed to an STT-MRAM device that satisfies this need. An STT-MRAM element having features of the present invention comprises a multilayered seed structure formed by interleaving a first type sublayer and a second type sublayer to form one or more repeats of a unit bilayer structure and a first magnetic layer formed on top of the multilayered seed structure. The unit bilayer structure is made of the first and second type sublayers with at least one of the first and second type sublayers including therein one or more ferromagnetic elements. The multilayered seed structure may be amorphous or non-magnetic or both. The unit bilayer structure may be made of CoFeB and Ta sublayers.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
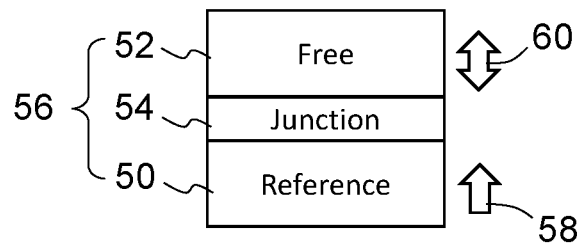
FIG. 1 is a cross sectional view of a conventional perpendicular magnetic tunnel junction.

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure of layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a $[Co/Pt]_n$ superlattice would denote a structure formed by n stacks of bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 2:
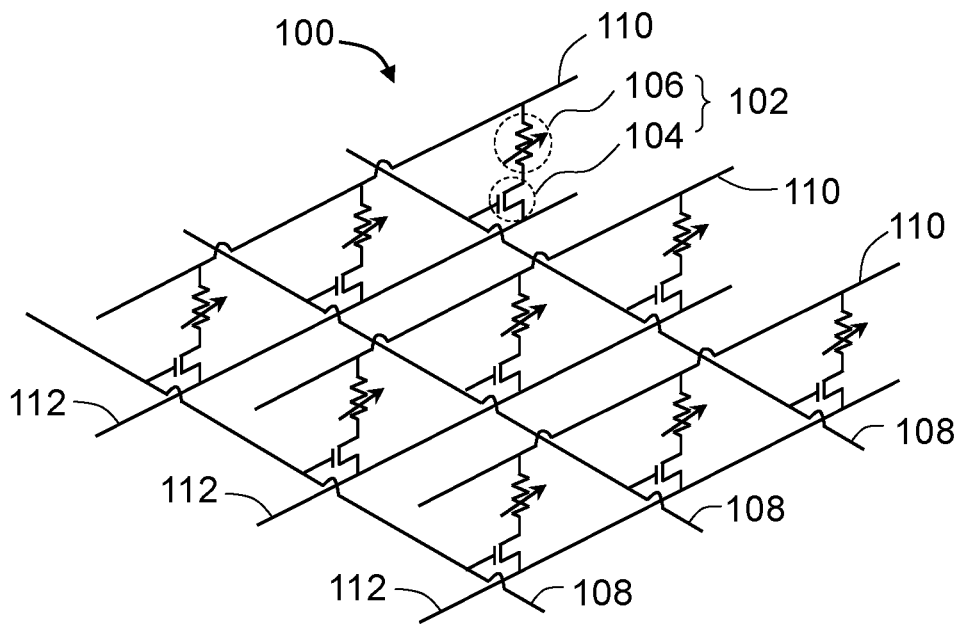
FIG. 2 is a schematic circuit diagram of an STT-MRAM device according to an embodiment of the present invention.

FIG. 2 is a schematic circuit diagram of an STT-MRAM device 100 according to an embodiment of the present invention. The STT-MRAM device 100 comprises a plurality of memory cells 102 with each of the memory cells 102 including a selection transistor 104 coupled to a MTJ memory element 106; a plurality of parallel word lines 108 with each being coupled to gates of a respective row of the selection transistors 104 in a first direction; and a plurality of parallel bit lines 110 with each being coupled to a respective row of the memory elements 106 in a second direction substantially perpendicular to the first direction. The STT-MRAM device 100 may optionally include a plurality of parallel source lines 112 with each being coupled to a respective row of the selection transistors 104 in the first or second direction.

Figure 3:
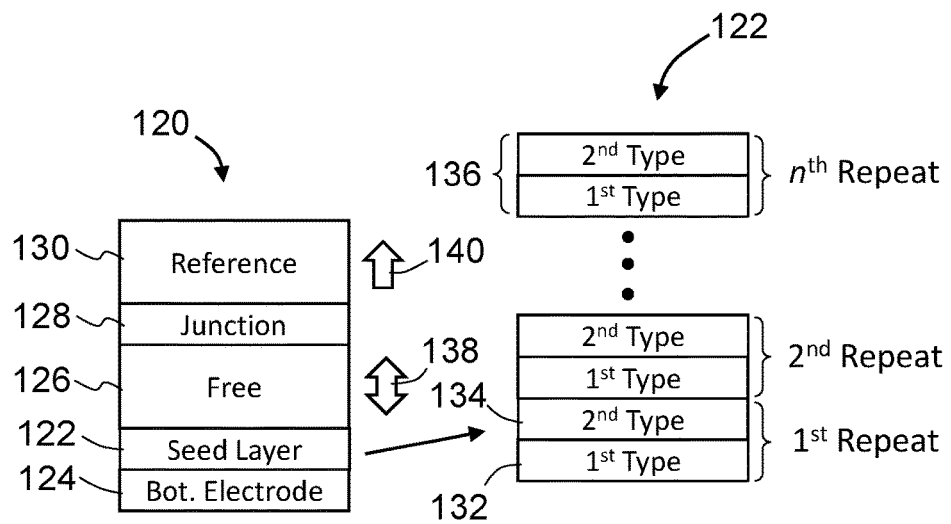
FIG. 3 is a cross sectional view of an embodiment of the present invention as applied to a perpendicular MTJ memory element having a multilayered seed structure.

The MTJ memory element 106 has a perpendicular MTJ structure that includes a multilayered seed structure. An embodiment of the present invention as applied to a perpendicular MTJ memory element will now be described with reference to FIG. 3. Referring now to FIG. 3, the illustrated perpendicular MTJ memory element 120 comprises a multilayered seed structure 122 formed on top of an optional bottom electrode 124, a magnetic free layer 126 formed on top of the multilayered seed structure 122, an insulating tunnel junction layer 128 formed on top of the magnetic free layer 126, and a magnetic reference layer 130 formed on top of the insulating tunnel junction layer 128. The memory element 120 may optionally include an underlayer (not shown) interposed between the multilayered seed structure 122 and the magnetic free layer 126.

Figure 4:
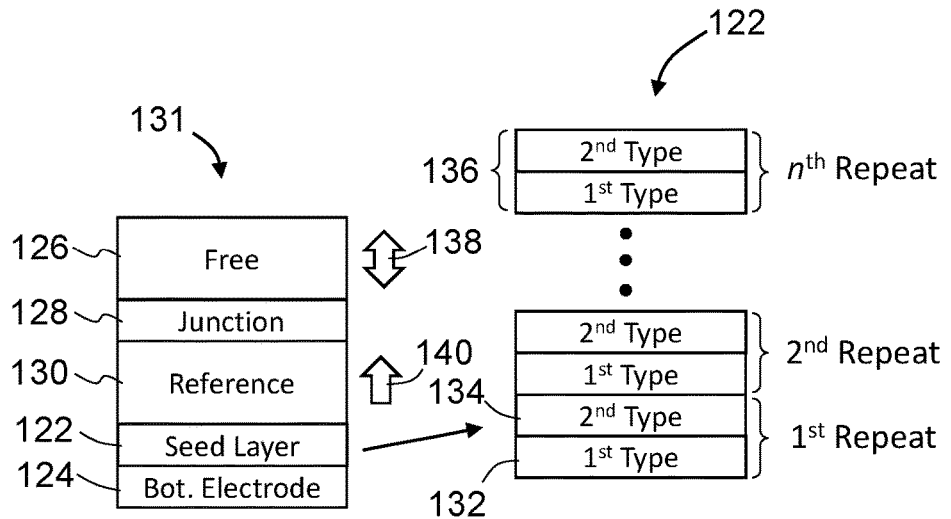
FIG. 4 is a cross sectional view of another embodiment of the present invention as applied to a perpendicular MTJ memory element having a multilayered seed structure.

FIG. 4 illustrates another embodiment of the present invention that comprises a multilayered seed structure 122 formed on top of an optional bottom electrode 124, a magnetic reference layer 130 formed on top of the multilayered seed structure 122, an insulating tunnel junction layer 128 formed on top of the magnetic reference layer 130, and a magnetic free layer 126 formed on top of the insulating tunnel junction layer 128. The memory element 131 may optionally include an underlayer (not shown) interposed between the multilayered seed structure 122 and the magnetic reference layer 130. The memory element 131 of FIG. 4 differs from the memory element 120 of FIG. 3 in that the stacking order of the magnetic free layer 126 and the magnetic reference layer 130 is reversed. Therefore, the memory elements 120 and 131 have "top-pinned" and "bottom-pinned" structures, respectively.

One of the functions of the multilayered seed structure 122 of FIGS. 3 and 4 is to provide a smooth surface for the magnetic free layer 126 or the magnetic reference layer 130 to form upon. The multilayered seed structure 122 is formed by interleaving a first type sublayer 132 and a second type sublayer 134 to form n number of stacks or repeats of a unit bilayer structure 136 made of the first and second type sublayers 132 and 134, where n is an integer greater or equal to 1. At least one of the first and second type sublayers 132 and 134 includes therein one or more ferromagnetic elements. The multilayered seed structure 122 has a structure denoted by [first type sublayer/second type sublayer]$_n$ with the first and second type sublayers 132 and 134 on bottom and top, respectively.

The first type sublayer 132 is preferred to be smooth and may be amorphous. The first type sublayer 132 may be made of a material comprising at least one non-magnetic element selected from the group consisting of titanium (Ti), zirconium (Zr), hafnium (Hf), vanadium (V), niobium (Nb), tantalum (Ta), chromium (Cr), molybdenum (Mo), tungsten (W), platinum (Pt), palladium (Pd), and ruthenium (Ru).

Alternatively, the first type sublayer 132 may comprise one or more ferromagnetic elements, such as but not limited to cobalt (Co), nickel (Ni), and iron (Fe), to form a material, such as but not limited to Co, Ni, Fe, CoNi, CoFe, NiFe, CoNiFe. The first type sublayer 132 may further include at least one non-magnetic element, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), and phosphorus (P), to form an alloy or compound, such as but not limited to cobalt-iron-boron (CoFeB), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB) or cobalt-iron-phosphorous (CoFeP). The first type sublayer 132 may be non-magnetic if the content of the magnetic elements is below the threshold required for becoming magnetized.

The first type sublayer 132 may have a thickness of at least about 0.2 nm, preferably about 0.4 to 3.0 nm, more preferably about 0.4 nm to 2.5 nm. Accordingly, in embodiments where the first type sublayer 132 includes therein magnetic elements, the first type sublayer 132 may become non-magnetic or behave like a magnetic dead layer when the thickness decreases to a point that the supposedly ferromagnetic material becomes superparamagnetic.

Like the first type sublayer 132, the second type sublayer 134 is preferred to be smooth and may be amorphous. The second type sublayer 134 may be made of any suitable material for the first type sublayer 132 as described above and may have the same thickness ranges as the first type sublayer 132 as described above.

In an embodiment, the first type sublayer 132 is made of Ta and has a thickness of about 2.0 nm, while the second type sublayer 134 is made of CoFeB and has a thickness of about 0.6 nm. Both the 2.0 nm thick Ta and the 0.6 nm thick CoFeB may be amorphous. Moreover, the 0.6 nm thick CoFeB may be non-magnetic or superparamagnetic, thereby rendering the multilayered seed structure 122 to be non-magnetic. The multilayered seed structure 122 made of [Ta/CoFeB]$_n$ preferably has 2 or 3 repeats of the unit bilayer structure 136, i.e. n=2 or 3.

Alternatively, the multilayered seed structure 122 may be made of [CoFeB/Ta]$_n$, [CoFeB/Ru]$_n$, [Ru/CoFeB]$_n$, [CoFeB/FeZrB]$_n$, [FeZrB/CoFeB]$_n$, [FeZrB/Ta]$_n$, or [Ta/FeZrB]$_n$. In embodiments where the second type sublayer 134, which is on top of the multilayered seed structure 122, is not made of Ta, an optional underlayer made of Ta (not shown) may be inserted between the multilayered seed structure 122 and the magnetic free layer 126 of FIG. 3 to prevent direct contact therebetween. Similarly, an optional underlayer made of Ta (not shown) may be inserted between the multilayered seed structure 122 and the magnetic reference layer 130 of FIG. 4. In embodiments where the first type sublayer 132, which is on bottom of the multilayered seed structure 122, is not made of Ta, the optional bottom electrode 124 made of Ta may be added to isolate the multilayered seed structure 122 of FIGS. 3 and 4 from structures therebeneath. The multilayered seed structure 122 may not exhibit the characteristic satellite peaks associated with superlattice when analyzed by X-ray or neutron diffraction, especially when one or both of the first and second type layers 132 and 134 are amorphous.

The magnetic free layer 126 of FIGS. 3 and 4 has a variable magnetization direction 138 substantially perpendicular to the layer plane thereof. The magnetic free layer 126 may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of the magnetic free layer 126 may further include at least one non-magnetic element, such as but not limited to B, Ti, Zr, Hf, V, Nb, Ta, Cr, Mo, W, Al, Si, Ge, Ga, O, N, C, Pt, Pd, Ru, or P, to form a magnetic alloy or compound, such as but not limited to FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa. In an embodiment, the magnetic free layer 126 is made of an alloy comprising Co, Fe, and B.

Alternatively, the magnetic free layer 126 may comprise at least two magnetic sublayers with each of the magnetic sublayers made of a suitable magnetic material for the magnetic free layer 126 as described above. The magnetic free layer 126 may further comprise at least one insertion or perpendicular enhancement layer (PEL) made of a suitable non-magnetic material, such as but not limited to Ta, W, Hf, or Ru, between the magnetic sublayers. In an embodiment, the magnetic free layer 126 comprises two magnetic sublayers with a Ta perpendicular enhancement layer (PEL) interposed therebetween.

The insulating tunnel junction layer 128, which has an energy barrier through which electrons can pass by tunnel effect, may be made of any suitable insulating material, such as but not limited to magnesium oxide (MgO) and aluminum oxide (AlO$_x$).

The magnetic reference layer 130 of FIGS. 3 and 4 has a first fixed magnetization direction 140 substantially perpendicular to the layer plane thereof. The magnetic reference layer 130 may comprise one or more ferromagnetic elements, such as but not limited to Co, Ni, and Fe, to form a magnetic material, such as but not limited to Co, Ni, Fe, CoNi, CoFe, NiFe, or CoNiFe. The magnetic material of the magnetic reference layer 130 may further include at least one non-magnetic element, such as but not limited to samarium (Sm), neodymium (Nd), B, Ti, Zr, Hf, V, Nb, Ta, Cr, Mo, W, Al, Si, Ge, Ga, O, N, C, Pt, Pd, Ru, or P, to form a magnetic alloy or compound, such as but not limited to SmCo, NdFeB, FePt, CoPt, CoFeB, CoFeBTi, CoFeBZr, CoFeBHf, CoFeBV, CoFeBTa, CoFeBCr, CoFeTi, CoFeZr, CoFeHf, CoFeV, CoFeNb, CoFeTa, CoFeCr, CoFeMo, CoFeW, CoFeAl, CoFeSi, CoFeGe, CoFeP, CoCr, CoCrB, CoCrPt, CoCrPtB, CoCrPd, CoCrTi, CoCrZr, CoCrHf, CoCrV, CoCrNb, or CoCrTa. In an embodiment, the magnetic reference layer 130 is made of an alloy comprising Co, Fe, and B.

Alternatively, the magnetic reference layer 130 may comprise at least two magnetic sublayers with each of the magnetic sublayers made of a suitable magnetic material for the magnetic reference layer 130 as described above. The magnetic reference layer 130 may further comprise at least one insertion or perpendicular enhancement layer (PEL) made of a suitable non-magnetic material, such as but not limited to Ta, W, Hf, or Ru, between the magnetic sublayers. In an embodiment, the magnetic reference layer 130 comprises two magnetic sublayers with a Ta perpendicular enhancement layer (PEL) interposed therebetween. In another embodiment, the magnetic reference layer 130 comprises two magnetic sublayers with each sublayer comprising cobalt and iron.

Still alternatively, the magnetic reference layer 130 may have a multilayer structure formed by interleaving at least two different types of materials with at least one of the at least two different types of materials being magnetic, such as but not limited to [Co/Pt]$_n$, [Pt/Co]$_n$, [Co/Pd]$_n$, [Pd/Co]$_n$, [Co/Ni]$_n$, [Ni/Co]$_n$, [CoFe/Pt]$_n$, [Pt/CoFe]$_n$, [Pt(Pd)/Co]$_n$, or [Co/Pt(Pd)]$_n$. The multilayer structure of the magnetic reference layer 130 may or may not exhibit the characteristic satellite peaks associated with superlattice when analyzed by X-ray or neutron diffraction.

The optional bottom electrode 124 of FIGS. 3 and 4 may be made of any suitable conductor, such as but not limited to Ta, tantalum nitride (TaN), Ti, titanium nitride (TiN), W, Ru, copper (Cu), or CuN. In embodiments where the first type sublayer 132, which is on bottom of the multilayered seed structure 122, is not made of Ta, the optional bottom electrode 124 made of Ta may be added to isolate the multilayered seed structure 122 from structures therebeneath.

It should be noted that the positions of the magnetic free layer 126 and the magnetic reference layer 130 shown in FIG. 3 can be swapped without affecting the performance of the memory element 120. Accordingly, the magnetic reference layer 130 may alternatively form on the multilayered seed structure 122 with the insulating tunnel junction layer 128 formed on the magnetic reference layer 130 and the magnetic free layer 126 formed on the insulating tunnel junction layer 128, as illustrated in FIG. 4.

Figure 5:
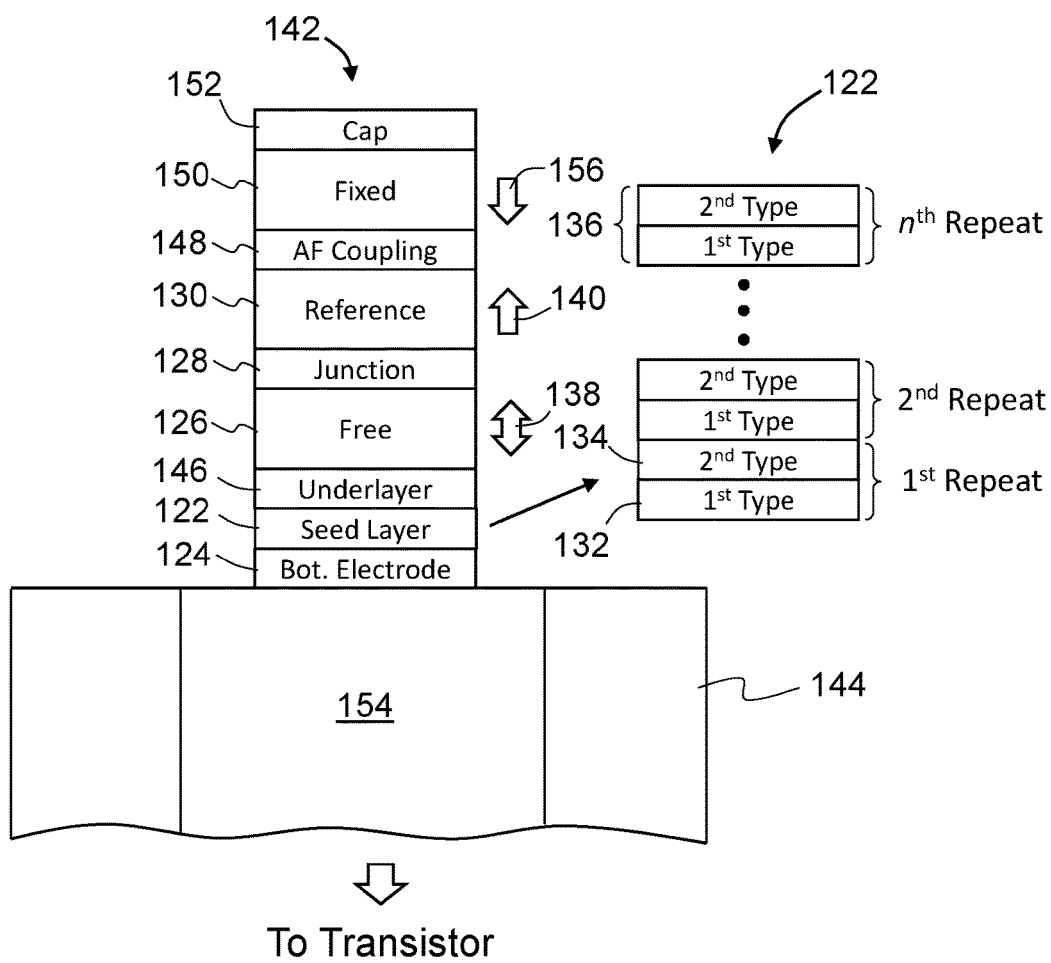
FIG. 5 is a cross sectional view of still another embodiment of the present invention as applied to a perpendicular MTJ memory element having a multilayered seed structure.

Another embodiment of the present invention as applied to a perpendicular MTJ memory element will now be described with reference to FIG. 5. In the drawing, numerals 122 to 140 denote the same components or features as those shown in FIG. 3. Compared with the memory element 120 of FIG. 3, the illustrated MTJ memory element 142 of FIG. 5 further includes a substrate 144 upon which the optional bottom electrode 124 forms, an optional underlayer 146 formed between the multilayered seed structure 122 and the magnetic free layer 126, an anti-ferromagnetic coupling layer 148 formed on top of the magnetic reference layer 130, a magnetic fixed layer 150 formed on top of the anti-ferromagnetic coupling layer 148, and an optional cap layer 152 formed on top of the magnetic fixed layer 150. The substrate may include therein a contact 154 coupled to the optional bottom electrode 124. In embodiments where the optional bottom electrode 124 is not used, the multilayered seed structure 122 forms directly on the substrate 144 or the contact 154. Similarly, in embodiments where the optional underlayer 146 is not present, the magnetic free layer 126 forms directly on the multilayered seed structure 122.

The substrate 144 is made of an insulating material and may include therein the optional contact 154 coupled to a selection transistor (not shown) therebeneath. The contact 154 may be made of any suitable conductor, such as but not limited to Ta, Cu, W, Ti, Ru, TaN, CuN, TiN, or any combination thereof.

One of the functions of the optional underlayer 146 is to separate the magnetic free layer 126 from the multilayered seed structure 122 when the second type sublayer 134, which is on top of the multilayered seed structure 122, is not made of Ta. The underlayer 146 may be made of any suitable material, such as but not limited to Ti, Zr, Hf, V, Nb, Ta, Cr, Mo, W, Rh, Pd, Pt, Cu, Ag, Ru, or any combination thereof.

The magnetic fixed layer 150 has a second fixed magnetization direction 156 that is substantially perpendicular to the layer plane thereof and is substantially opposite to the first fixed magnetization direction 140 of the magnetic reference layer 130. The magnetic fixed layer 150 provides anti-ferromagnetic coupling to the magnetic reference layer 130 by pinning the magnetization direction 140 thereof in opposite orientation relative to that of the magnetic fixed layer 150 through the anti-ferromagnetic coupling layer 148, which may be made of a material comprising at least one element selected from the group consisting of ruthenium (Ru), rhodium (Rh), iridium (Ir), tantalum (Ta), manganese (Mn), oxygen (O), and nitrogen (N). In an embodiment, the anti-ferromagnetic coupling layer 148 is made of Ru or Ta. Another function of the magnetic fixed layer 150, which has an opposite magnetization direction 156 compared with the magnetic reference layer 130, is to cancel, as much as possible, the stray magnetic field exerted by the magnetic reference layer 130 on the magnetic free layer 126, thereby minimizing the offset field or net external field at the magnetic free layer 126.

The magnetic fixed layer 150 may have any suitable structure as describe above for the magnetic reference layer 130, such as single layer or multilayer structure. The magnetic fixed layer 150 may be made of any suitable magnetic material for the magnetic reference layer 130 as described above. In an embodiment, the magnetic fixed layer 150 is made of $[Co/Pt]_n$, $[Pt/Co]_n$, $[Co/Ni]_n$, $[Ni/Co]_n$, or any combination thereof. In another embodiment, the magnetic fixed layer 150 is made of an alloy comprising Co, Fe, and B.

The optional cap layer 152 may be made of any suitable material, such as but not limited to Ti, Zr, Hf, V, Nb, Ta, Cr, Mo, W, Rh, Pd, Pt, Cu, Ag, Ru, or any combination thereof. The optional cap layer 152 may alternatively be formed of any suitable structure for the multilayered seed structure 122 as described above.

Figure 6:
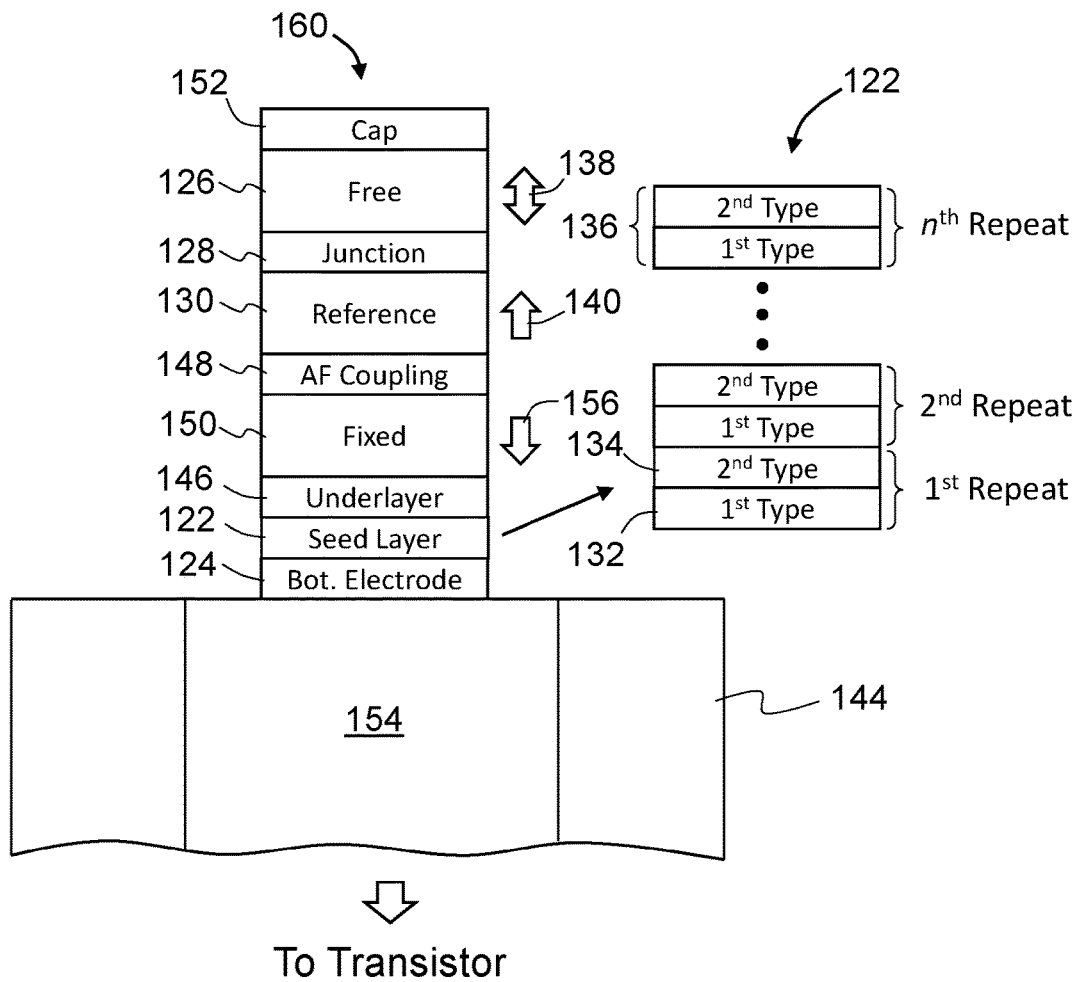
FIG. 6 is a cross sectional view of yet another embodiment of the present invention as applied to a perpendicular MTJ memory element having a multilayered seed structure.

Like the memory element 120 of FIG. 3, the stacking order of the magnetic layers 126, 130, and 150 of the memory element 142 may be inverted without affecting the performance thereof. The resulting structure, as illustrated in FIG. 6, comprises the multilayered seed structure 122 forms on the substrate 144 or the contact 154, the magnetic fixed layer 150 formed on the multilayered seed structure 122, the anti-ferromagnetic coupling layer 148 formed on the magnetic fixed layer 150, the magnetic reference layer 130 formed on the anti-ferromagnetic coupling layer 148, the insulating tunnel junction layer 128 formed on the magnetic reference layer 130, the magnetic free layer 126 formed on the insulating tunnel junction layer 128, and the optional cap layer formed on the magnetic free layer 126. The memory element 160 of FIG. 6 may include the optional bottom electrode 124 formed between the multilayered seed structure 122 and the substrate 144 or the contact 154, or the optional underlayer 146 formed between the multilayered seed structure 122 and the magnetic fixed layer 150, or both. In an embodiment, the magnetic fixed layer is made of $[Co/Pt]_n$, $[Pt/Co]_n$, $[Co/Ni]_n$, $[Ni/Co]_n$, or any combination thereof. In another embodiment, the magnetic reference layer 130 includes two magnetic sublayers in contact with each sublayer comprising cobalt and iron. For example, one magnetic sublayer formed adjacent to the anti-ferromagnetic layer 148 may comprise cobalt and iron, while the other magnetic sublayer formed adjacent to the insulating tunnel junction layer 128 may comprise cobalt, iron, and boron, or comprise cobalt, iron, and tantalum.

The previously described embodiments of the present invention have many advantages, including high perpendicular anisotropy and minimum offset field. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic random access memory element comprising:

a multilayered seed structure formed by interleaving multiple layers of a first transition metal with multiple layers of a second transition metal; and a first magnetic layer formed on top of said multilayered seed structure, said first magnetic layer having a multilayer structure formed by interleaving layers of said first transition metal with layers of a magnetic material and having a first fixed magnetization direction substantially perpendicular to a layer plane thereof, wherein said first and second transition metals are non-magnetic.

2. The magnetic random access memory element according to claim 1, wherein said first transition metal is platinum.

3. The magnetic random access memory element according to claim 1, wherein said first transition metal is palladium.

4. The magnetic random access memory element according to claim 1, wherein said second transition metal is tantalum.

5. The magnetic random access memory element according to claim 1, wherein said second transition metal is titanium.

6. The magnetic random access memory element according to claim 1, wherein said second transition metal is tungsten.

7. The magnetic random access memory element according to claim 1, wherein said second transition metal is chromium.

8. The magnetic random access memory element according to claim 1, wherein said second transition metal is selected from the group consisting of zirconium, hafnium, vanadium, niobium, and molybdenum.

9. The magnetic random access memory element according to claim 1, wherein the magnetic material is Co or CoFe.

10. The magnetic random access memory element according to claim 1 further comprising:

an anti-ferromagnetic coupling layer formed on top of said first magnetic layer; and a second magnetic layer formed on top of said anti-ferromagnetic coupling layer, wherein said second magnetic layer has a second fixed magnetization direction that is substantially perpendicular to a layer plane thereof and is substantially opposite to said first fixed magnetization direction.

11. The magnetic random access memory element according to claim 10, wherein said second magnetic layer includes at least two magnetic sublayers, one of said at least two magnetic sublayers being made of CoFeB.

12. The magnetic random access memory element according to claim 10 further comprising:

an insulating tunnel junction layer formed on top of said second magnetic layer; and a third magnetic layer formed on top of said insulating tunnel junction layer, wherein said third magnetic layer has a variable magnetization direction substantially perpendicular to a layer plane thereof.

13. The magnetic random access memory element according to claim 12, wherein said third magnetic layer includes at least a magnetic sublayer made of CoFeTa, CoFeHf, or CoFeMo.

14. The magnetic random access memory element according to claim 12, wherein said third magnetic layer includes at least a magnetic sublayer made of CoFeB.

15. The magnetic random access memory element according to claim 12, wherein said third magnetic layer is made of CoFeB.

16. A magnetic random access memory element comprising:

a multilayered seed structure formed by interleaving one or more layers of nickel with one or more layers of molybdenum; and a first magnetic layer formed on top of said multilayered seed structure, said first magnetic layer having a first fixed magnetization direction substantially perpendicular to a layer plane thereof.

17. The magnetic random access memory element according to claim 16, wherein said multilayered seed structure is formed by interleaving multiple layers of nickel with multiple layers of molybdenum.

18. The magnetic random access memory element according to claim 16, wherein said first magnetic layer is formed by interleaving layers of a first type material with layers of a second type material, at least one of said first and second type materials being magnetic.

19. The magnetic random access memory element according to claim 18, wherein said first type material is Co or CoFe.

20. The magnetic random access memory element according to claim 18, wherein said second type material is Ni, Pd, Pt, or any combination thereof.

* * * * *